United States Patent [19]
Chung

[11] Patent Number: 6,044,484
[45] Date of Patent: Mar. 28, 2000

[54] METHOD AND CIRCUIT FOR ERROR CHECKING AND CORRECTION IN A DECODING DEVICE OF COMPACT DISC-READ ONLY MEMORY DRIVE

[75] Inventor: Sung-Hyun Chung, Ahnsan, Rep. of Korea

[73] Assignee: Samsung Electronics Co., Ltd., Kyungki-do, Rep. of Korea

[21] Appl. No.: 08/992,911

[22] Filed: Dec. 18, 1997

[30]     Foreign Application Priority Data

Apr. 10, 1997  [KR]    Rep. of Korea .................. 97-13200

[51] Int. Cl.⁷ ........................................ G11C 29/00
[52] U.S. Cl. .................. 714/766; 714/767; 714/768; 365/238.5
[58] Field of Search ................................ 714/763–773; 365/189.05, 238.5

[56]           References Cited

U.S. PATENT DOCUMENTS

| | | | |
|---|---|---|---|
| 4,847,705 | 7/1989 | Weng et al. ........................... | 360/49 |
| 4,901,318 | 2/1990 | Tomisawa ............................. | 714/763 |
| 5,077,720 | 12/1991 | Takagi et al. ........................ | 369/59 |
| 5,455,795 | 10/1995 | Nakao et al. ........................ | 365/189.05 |
| 5,500,819 | 3/1996 | Runas ................................... | 365/189.05 |
| 5,691,943 | 11/1997 | Yun ...................................... | 365/189.05 |

*Primary Examiner*—Emmanuel L. Moise
*Attorney, Agent, or Firm*—Sughrue, Mion, Zinn, Macpeak & Seas, PLLC

[57]           ABSTRACT

Memory read circuit and method for reducing the number of the memory read cycles required for ECC. The memory read method for ECC of a data memory, which stores sector data reproduced from a compact disc in a decoding device of a compact disc-ROM drive, includes the step of reading the data memory in a page mode read cycle having a page length which corresponds to a physical address where symbols for ECC are stored at the data memory.

10 Claims, 10 Drawing Sheets

(a)

ADDRESS  MODE 1

| Address | Field |
|---|---|
| 400 | EDC (2WORD) |
| | ZERO (4WORD) |
| | ECC PARITY (138WORD) |
| 490 | UNUSAGE REGION (48WORD) |
| 4C0 | SUB CODE (48WORD) |
| 4F0 | UNUSAGE REGION (15WORD) |
| 4FF | C2PO (147WORD) |
| 592 | UNUSAGE REGION (102WORD) |
| 7F8 | SYNCHRONIZATION (6WORD) |
| 7FF | HEADER (2WORD) |

(b)

ADDRESS  MODE 2

| Address | Field |
|---|---|
| 400 | EDC (2WORD) |
| | ECC PARITY (138WORD) |
| 48C | UNUSAGE REGION (52WORD) |
| 4C0 | SUB CODE (48WORD) |
| 4F0 | UNUSAGE REGION (15WORD) |
| 4FF | C2PO (147WORD) |
| 592 | UNUSAGE REGION (98WORD) |
| 7F4 | SYNCHRONIZATION (6WORD) |
| | HEADER (2WORD) |
| 7FF | SUBHEADER (4WORD) |

FIG. 5

P CODE WORD NUMBER

| SYMBOL NUMBER | 0 | 1 | 2 | ~ | 36 | 37 | 38 | 39 | 40 | 41 | 42 |
|---|---|---|---|---|---|---|---|---|---|---|---|
| 0 | 161FE | 161FF | 0 |  | 22 | 23 | 24 | 25 | 26 | 27 | 28 |
| 1 | 29 | 2A | 2B |  | 4D | 4E | 4F | 50 | 51 | 52 | 53 |
| 2 | 54 | 55 | 56 | ... | 78 | 79 | 7A | 7B | 7C | 7D | 7E |
| 3 | 7F | 80 | 81 |  | A3 | A4 | A5 | A6 | A7 | A8 | A9 |
| 4 | AA | AB | AC |  | CE | CF | D0 | D1 | D2 | D3 | D4 |
| 5 | D5 | D6 | D7 |  | F9 | FA | FB | FC | FD | FE | FF |
| 6 | 100 | 101 | 102 |  | 124 | 125 | 126 | 127 | 128 | 129 | 12A |
| 7 | 12B | 12C | 12D |  | 14F | 150 | 151 | 152 | 153 | 154 | 155 |
| 8 | 156 | 157 | 158 |  | 17A | 17B | 17C | 17D | 17E | 17F | 180 |
| 9 | 181 | 182 | 183 | ... | 1A5 | 1A6 | 1A7 | 1A8 | 1A9 | 1AA | 1AB |
| 10 | 1AC | 1AD | 1AE |  | 1D0 | 1D1 | 1D2 | 1D3 | 1D4 | 1D5 | 1D6 |
| 11 | 1D7 | 1D8 | 1D9 |  | 1FB | 1FC | 1FD | 1FE | 1FF | 200 | 201 |
| 12 | 202 | 203 | 204 |  | 226 | 227 | 228 | 229 | 22A | 22B | 22C |
| 13 | 22D | 22E | 22F |  | 251 | 252 | 253 | 254 | 255 | 256 | 257 |
| 14 | 258 | 259 | 25A |  | 27C | 27D | 27E | 27F | 280 | 281 | 282 |
| 15 | 283 | 284 | 285 | ... | 2A7 | 2A8 | 2A9 | 2AA | 2AB | 2AC | 2AD |
| 16 | 2AE | 2AF | 2B0 |  | 2D2 | 2D3 | 2D4 | 2D5 | 2D6 | 2D7 | 2D8 |
| 17 | 2D9 | 2DA | 2DB |  | 2FD | 2FE | 2FF | 300 | 301 | 302 | 303 |
| 18 | 304 | 305 | 306 |  | 328 | 329 | 32A | 32B | 32C | 32D | 32E |
| 19 | 32F | 330 | 331 |  | 353 | 354 | 355 | 356 | 357 | 358 | 359 |
| 20 | 35A | 35B | 35C |  | 37E | 37F | 380 | 381 | 382 | 383 | 384 |
| 21 | 385 | 386 | 387 | ... | 3A9 | 3AA | 3AB | 3AC | 3AD | 3AE | 3AF |
| 22 | 3B0 | 3B1 | 3B2 |  | 3D4 | 3D5 | 3D6 | 3D7 | 3D8 | 3D9 | 3DA |
| 23 | 3DB | 3DC | 3DD |  | 3FF | 16000 | 16001 | 16002 | 16003 | 16004 | 16005 |
| 24 | 16006 | 16007 | 16008 |  | 1602A | 1602B | 1602C | 1602D | 1602E | 1602F | 16030 |
| 25 | 16031 | 16032 | 16033 | ... | 16055 | 16056 | 16057 | 16058 | 16059 | 1605A | 1605B |

FIG. 8a

P CODE WORD NUMBER

| SYMBOL NUMBER | 0 | 1 | 2 | 3 | 4 | 5 | 6 | ~ | 40 | 41 | 42 |
|---|---|---|---|---|---|---|---|---|---|---|---|
| 0 | 161FA | 161FB | 161FC | 161FD | 161FE | 161FF | 0 | | 22 | 23 | 24 |
| 1 | 25 | 26 | 27 | 28 | 29 | 2A | 2B | | 4D | 4E | 4F |
| 2 | 50 | 51 | 52 | 53 | 54 | 55 | 56 | | 78 | 79 | 7A |
| 3 | 7B | 7C | 7D | 7E | 7F | 80 | 81 | | A3 | A4 | A5 |
| 4 | A6 | A7 | A8 | A9 | AA | AB | AC | | CE | CF | D0 |
| 5 | D1 | D2 | D3 | D4 | D5 | D6 | D7 | | F9 | FA | FB |
| 6 | FC | FD | FE | FF | 100 | 101 | 102 | | 124 | 125 | 126 |
| 7 | 127 | 128 | 129 | 12A | 12B | 12C | 12D | | 14F | 150 | 151 |
| 8 | 152 | 153 | 154 | 155 | 156 | 157 | 158 | | 17A | 17B | 17C |
| 9 | 17D | 17E | 17F | 180 | 181 | 182 | 183 | | 1A5 | 1A6 | 1A7 |
| 10 | 1A8 | 1A9 | 1AA | 1AB | 1AC | 1AD | 1AE | | 1D0 | 1D1 | 1D2 |
| 11 | 1D3 | 1D4 | 1D5 | 1D6 | 1D7 | 1D8 | 1D9 | | 1FB | 1FC | 1FD |
| 12 | 1FE | 1FF | 200 | 201 | 202 | 203 | 204 | | 226 | 227 | 228 |
| 13 | 229 | 22A | 22B | 22C | 22D | 22E | 22F | | 251 | 252 | 253 |
| 14 | 254 | 255 | 256 | 257 | 258 | 259 | 25A | | 27C | 27D | 27E |
| 15 | 27F | 280 | 281 | 282 | 283 | 284 | 285 | | 2A7 | 2A8 | 2A9 |
| 16 | 2AA | 2AB | 2AC | 2AD | 2AE | 2AF | 2B0 | | 2D2 | 2D3 | 2D4 |
| 17 | 2D5 | 2D6 | 2D7 | 2D8 | 2D9 | 2DA | 2DB | | 2FD | 2FE | 2FF |
| 18 | 300 | 301 | 302 | 303 | 304 | 305 | 306 | | 328 | 329 | 32A |
| 19 | 32B | 32C | 32D | 32E | 32F | 330 | 331 | | 353 | 354 | 355 |
| 20 | 356 | 357 | 358 | 359 | 35A | 35B | 35C | | 37E | 37F | 380 |
| 21 | 381 | 382 | 383 | 384 | 385 | 386 | 387 | | 3A9 | 3AA | 3AB |
| 22 | 3AC | 3AD | 3AE | 3AF | 3B0 | 3B1 | 3B2 | | 3D4 | 3D5 | 3D6 |
| 23 | 3D7 | 3D8 | 3D9 | 3DA | 3DB | 3DC | 3DD | | 3FF | 16000 | 16001 |
| 24 | 16002 | 16003 | 16004 | 16005 | 16006 | 16007 | 16008 | | 1602A | 1602B | 1602C |
| 25 | 1602D | 1602E | 1602F | 16030 | 16031 | 16032 | 16033 | | 16055 | 16056 | 16057 |

FIG. 8b

METHOD AND CIRCUIT FOR ERROR CHECKING AND CORRECTION IN A DECODING DEVICE OF COMPACT DISC-READ ONLY MEMORY DRIVE

BACKGROUND OF THE INVENTION

1. Field of the Invention

The present invention relates to a decoding device for a compact disc-read only memory (hereinafter, referred to as "CD-ROM") drive, and more particularly, to a method and a circuit for reading a data memory which stores sector data reproduced from a CD (compact disc) in order to perform error checking and correction (hereinafter, referred to as "ECC").

2. Description of the Related Art

A decoding device of a conventional CD-ROM drive includes an ECC processor and performs ECC when decoding sector data. The sector data is reproduced from the CD and stored in the data memory, and the ECC processor reads symbols for ECC from the data memory and performs the ECC. A dynamic random access memory (hereinafter, referred to as "DRAM") can be used as the above data memory. The ECC processor reads the symbols one by one from the memory and performs ECC. Therefore, to date the number of memory read cycles must correspond to the number of the overall symbols.

As the CD-ROM drive has increasingly been operated at high speeds, ECC has accordingly been performed at a high speed. Nonetheless, since many memory read cycles are required for ECC, the amount of increase in operating speed is therefore limited.

SUMMARY OF TE INVENTION

It is an object of the present invention to provide a memory read circuit and method for reducing the number of memory read cycles required for ECC.

To achieve the above object, the present invention is provided with a memory read circuit for ECC of a data memory which stores sector data reproduced from a compact disc in a decoding device of a compact disc-ROM drive, including: a code word counter for counting the number of code words read from the data memory for ECC; a symbol counter for counting the number of symbols for each of the code words read from the data memory; an offset address generator for generating an offset address according to count values of the code word counter and the symbol counter; a block pointer for generating a block pointer value for designating a block for the sector data stored at the data memory as a unit block; a read controller for generating a physical address and read control signals for symbols to be currently read as designated by the offset address and the block pointer value; a read only memory for storing a page length value which is set in correspondence with the physical address where symbols for each code word for ECC are stored at the data memory regarding the sector data stored at the data memory, and for outputting the page length value according to count values of the code word counter and the symbol counter; and a page mode controller for operating the read controller in a page mode read cycle corresponding to the page length value output from the read only memory regarding symbols to be currently read, and to a code word presently the count values of the code word counter and the symbol counter.

Further, the present invention can achieve the above object with a memory read method of the data memory, which stores sector data reproduced from a compact disc in a decoding device of a compact disc-ROM drive, comprising the step of: reading the data memory in a page mode read cycle of page length in correspondence with a physical address where symbols for the ECC are stored at the data memory regarding the sector data stored at the data memory.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar components, wherein:

FIG. 5 shows an offset address of data stored at an auxiliary block region in one sector data;

FIGS. 8A and 8B are examples of setting page length values for P code word of a data block O and an auxiliary block O as shown in FIG. 2.

DETAILED DESCRIPTION OF THE PREFERRED EMBODIMENT(S)

Figure 1:
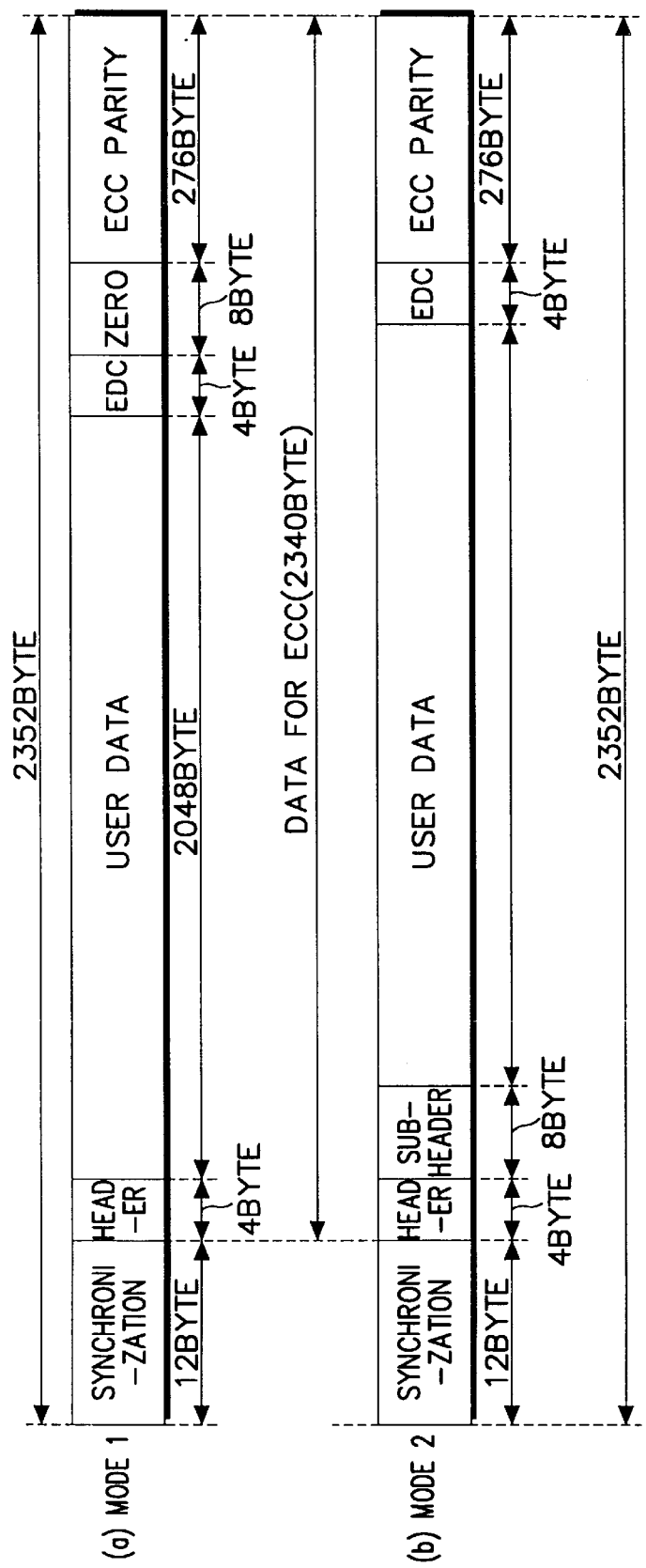
FIG. 1 shows a format of sector data in a conventional CD-ROM drive.

Hereinafter, a preferred embodiment of the present invention will be explained with reference to the accompanying drawings. Throughout the drawings, it is noted that the same reference numerals will be used to designate like or equivalent elements. Further, in the following description, numeral specific details such as concrete address values, the number of bytes or words, and timing of signals, are set forth to provide a more thorough understanding of the present invention. It will be apparent, however, to one skilled in the art that the present invention may be practiced without these specific details. The detailed description of known function and constructions unnecessarily obscuring the subject matter of the present invention will be avoided in the present invention.

FIG. 1 shows a format of sector data in a conventional CD-ROM drive, which is useful in understanding the present invention. Conventionally, in CD-ROM systems, sector data is composed of 2352 bytes and the format is divided into a mode 1 format and a mode 2 format according to the data processing pattern. The format of mode 2 is further divided into a form 1 and a form 2 depending upon existence/nonexistence of the ECC parity. FIG. 1(*a*) illustrates the sector data format of the mode 1 format and FIG. 1(*b*) illustrates form 1 of the mode 2 format. When compared with FIG. 1(*b*), the form 2 of the mode 2 (not shown) is composed of only EDC (map message decoder/encoder) parity without ECC parity.

The 2352 bytes of sector data includes 12 bytes of synchronization data for dividing each sector by a specific pattern. The synchronization data includes the data pattern of "00 FF FF FF FF FF FF FF FF FF FF 00". The 2340 bytes of data, except for the 12 bytes of synchronization data, becomes the data for ECC. As a result, in the mode 1 format of FIG. 1(a), the data for ECC includes the header 4 bytes, the user data 2048 bytes, the EDC 4 bytes, the zero 8 bytes, and the ECC parity 276 bytes. Also, in form 1 of the mode 2 format of FIG. 1(b), the data for ECC includes the header 4 bytes, the subheader 8 bytes, the user data 2048 bytes, the EDC 4 bytes, and the ECC parity 276 bytes.

Figure 2:
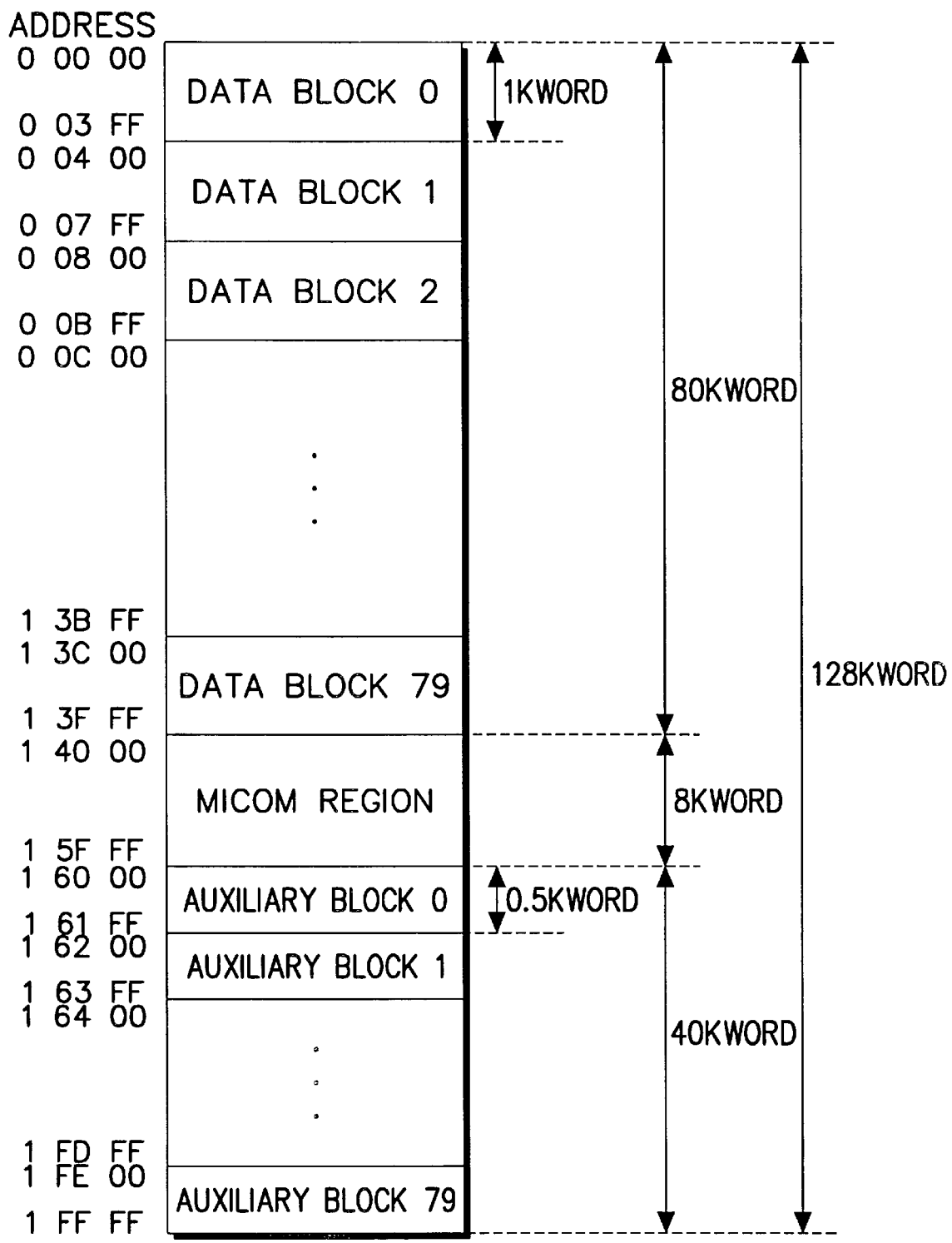
FIG. 2 shows a layout of a data memory in a conventional CD-ROM drive.

As described above, FIG. 2 shows a layout of the data memory in a conventional CD-ROM drive. Only the 2048 bytes of user data are stored at the data block region and the remnant thereof is stored at the auxiliary block region. The address circuit within the ECC process can be simplified by dividing the storing region of the data memory into the data block region and the auxiliary block region. Also, FIG. 2 is an example for storing 80 sector data by using the 1M bit memory as the data memory. That is, 80 data blocks are stored 1K word by 1K word (2048 bytes) at a 120K word storing region of the 128K word storing region and 80 auxiliary blocks are stored 0.5K word by 0.5K word (1024 bytes) thereat. The remnant 8K word region is the use region of a microcomputer (hereinafter, referred to as "MICOM") as a main controller of the CD-ROM drive. The storing region corresponding to address "0000"~"13FFF" in "00000"~"1FFFF" is the data block region, the storing region corresponding to address "14000"~"15FFF" therein is the MICOM region, and the storing region corresponding to address "16000"~"1FFFF" is the auxiliary block region.

Figure 3:
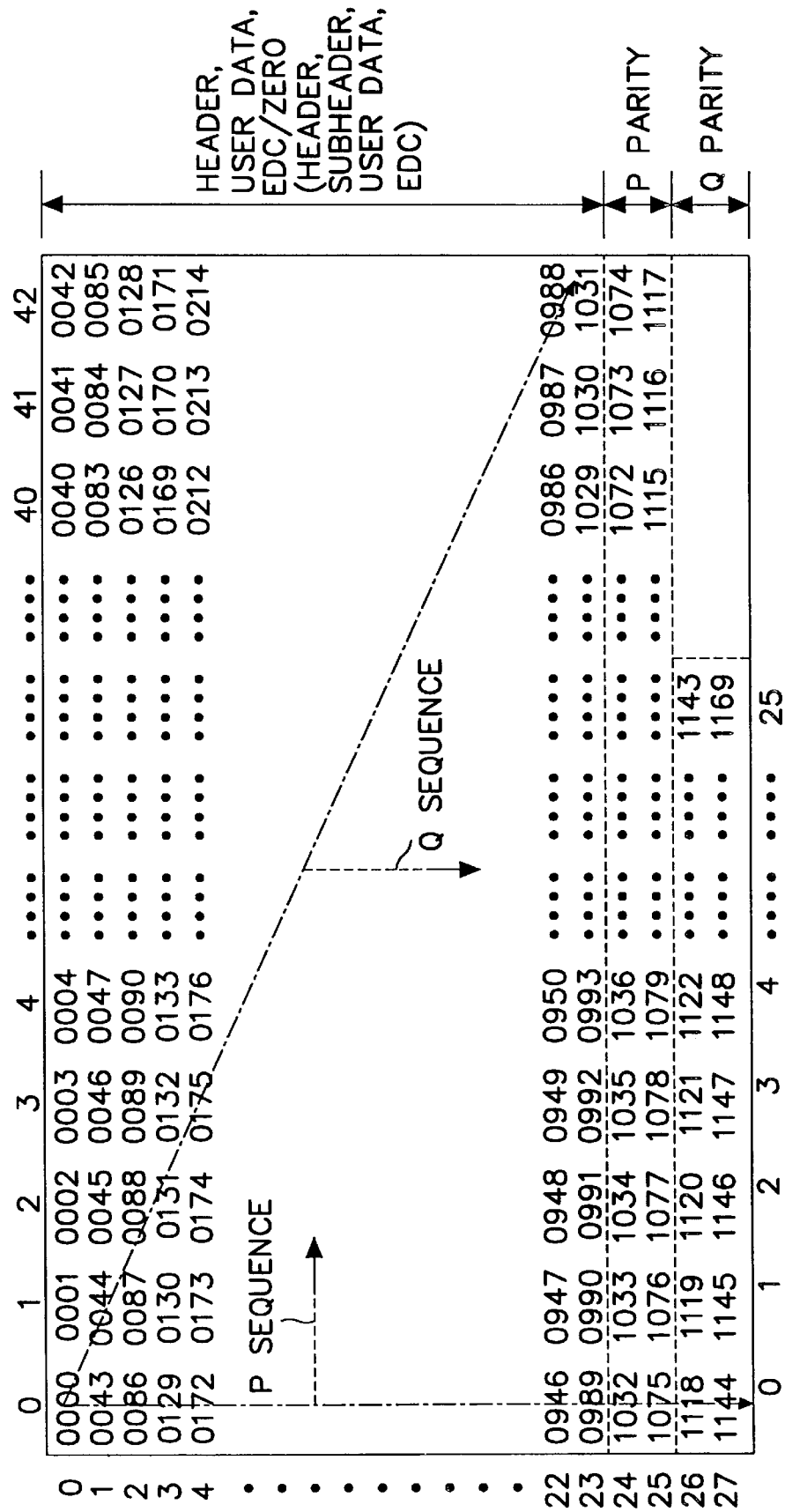
FIG. 3 shows a map of an ECC memory in a conventional CD-ROM drive.

FIG. 3 shows a map of the ECC memory in a conventional CD-ROM drive, where the memory map for the data for ECC of 2340 bytes is represented as offset values for each symbol. The offset value "0000"~"1169", expressed as a decimal, is for convenience considered from the header data and is given with serial numbers, which do not indicate the offset address on the real data memory. The data for ECC of the remnant 2340 bytes except for the synchronization data is again divided into even and odd bytes to perform ECC, wherein ECC for even/odd bytes is performed equally. The storing region of the data memory is divided into the left plane and the right plane, the even bytes in the data for ECC are stored at the left plane and the odd bytes therein are stored at the right plane. Accordingly, the ECC is processed for 1170 bytes at each plane. The memory map of FIG. 3 indicates offset values on the basis of the data in the left plane of the data memory.

ECC for the left plane is comprised of RSPC (reed-solomon product code)-Q and P data, RSPC-Q is comprised of (45,43,3)×26 code words and RSPC-P is comprised of (26,24,3)×43 code words. In (45,43,3) and (26,24,3), "45" and "26" represent the number of symbols, "43" and "24" represent the number of redundancy words, and "3" represents error correction capacity. ECC is processed for the sector data by adapting the above code words to the left plane and the right plane. At this moment, RSPC-Q code words (hereinafter, referred to as "Q code word") are included with a byte read while scanning as a Q sequence in a diagonal line direction as shown in FIG. 3, and RSPC-P code words (hereinafter, referred to as "P code word") are included with a byte read while scanning as a P sequence in a horizontal line direction as shown in FIG. 3. That is, the Q code word includes 45 bytes and 26 code words and the P code word includes 26 bytes and 43 code words. Thus, Q, P code words are respectively adapted for the equal byte. Consequently, ECC is performed dually.

Figure 4:
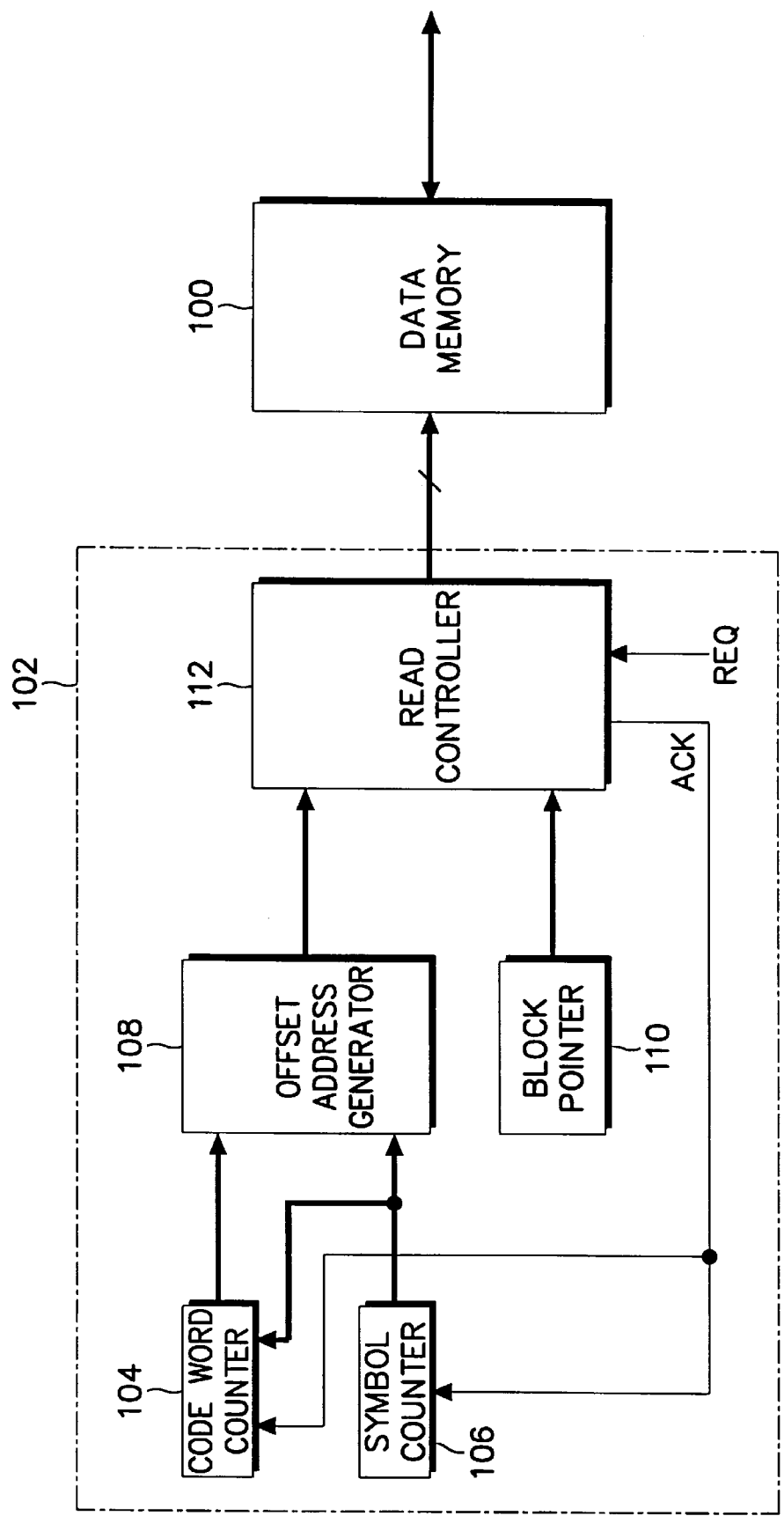
FIG. 4 is a block diagram showing a conventional memory read circuit.

FIG. 4 is a block diagram showing a memory read circuit, wherein the P code word is read from the data memory 100. A memory read circuit 102 of FIG. 4 exists in the ECC processor of the decoding device and generates physical addresses and read control signals for reading the data memory 100 located at an exterior of the ECC processor. Then, the data memory 100 temporarily stores the sector data read and reproduced from the CD as the DRAM as stated hereinabove.

The memory read circuit 102 is constructed with a code word counter 104, a symbol counter 106, an offset address generator 108, a block pointer 110 and a read controller 112. The code word counter 104 counts the number of the P code words, which are read from the data memory 100, by a count value of the symbol counter 106 for ECC, and applies the P code word count value to the offset address generator 108. As mentioned previously, a total of 43 P code words exist in the left plane of one sector and the count value of the code word counter 104 is varied from 0 to 42. The symbol counter 106 counts the number of the symbols which are read in one P code word, in response to a response signal ACK generated from the read controller 112, and applies the symbol count value to the offset address generator 108. Namely, the count value of the symbol counter 106 is increased one by one by the response signal ACK whenever reading one word data in the data memory 100, and is varied from 0 to 25. After the count value of the symbol counter 106 becomes 25, the count value of the code word counter 104 is increased by one.

Also, the offset address generator 108 generates an offset address depending upon the count values of the code word counter 104 and the symbol counter 106 and applies the generated offset address to the read controller 112. For example, when the count value of the code word counter 104 indicates i and the count value of the symbol counter 106 indicates j, the offset address indicates i+43×j.

For reference, the offset address regarding one sector data of 2352 bytes will be explained as follows. Firstly, the offset address of the user data of 2048 bytes corresponds to the address "000"~"3FF". The remnant except for the user data, that is, the offset address of the data stored at the left plane of the auxiliary block region is illustrated as in FIG. 5. FIG. 5 shows offset addresses of data stored at the auxiliary block region in sector data, wherein (a) is for the mode 1 format and (b) is for form 1 of the mode 2 format. In FIG. 5(a), the EDC 2 words are started from the offset address "400" and followed by the zero 4 words and the ECC parity 138 words, and the synchronization 6 words are started from the offset address "7F8" and followed by the header 2 words. In FIG. 5(b), the EDC 2 words are started from the offset address "400" and followed by the ECC parity 138 words, and the synchronization 6 words are started from the offset address "7F4" and followed by the header 2 words and the subheader 4 words.

Referring again to FIG. 4, the block pointer 110 applies the block pointer value designating one of the blocks of FIG. 2, to the read controller 112. The block pointer value, designated by the MICOM as the main controller of the CD-ROM drive or otherwise, is automatically increased by one upon completion of one block correction in the case that error correction of the several blocks is continuously performed in the decoding device. The read controller 112, which receives the block pointer value of the block pointer 110 and the offset address generated from the offset address generator 108, generates a real address for the data memory 100; that is to say, the physical address designating the region where the symbol to be read from the data memory 100 is actually stored, as well as generating the read control signals. The read controller 112 adds the offset address to the start address of the block designated by the block pointer value, generates a row address and a column address, multiplexes the generated addresses and applies the multiplexed addresses to the data memory 100. The symbols of 43 P code words according to the ECC memory map as illustrated of FIG. 3 in one sector data stored at the data memory 100 are sequentially designated one by one and read from the data memory 100 to the ECC processor. The read controller 112 generates the response signal ACK whenever reading each symbol from the data memory 100. The response signal ACK is applied to the code word counter 104 and the symbol counter 106.

Figure 6:
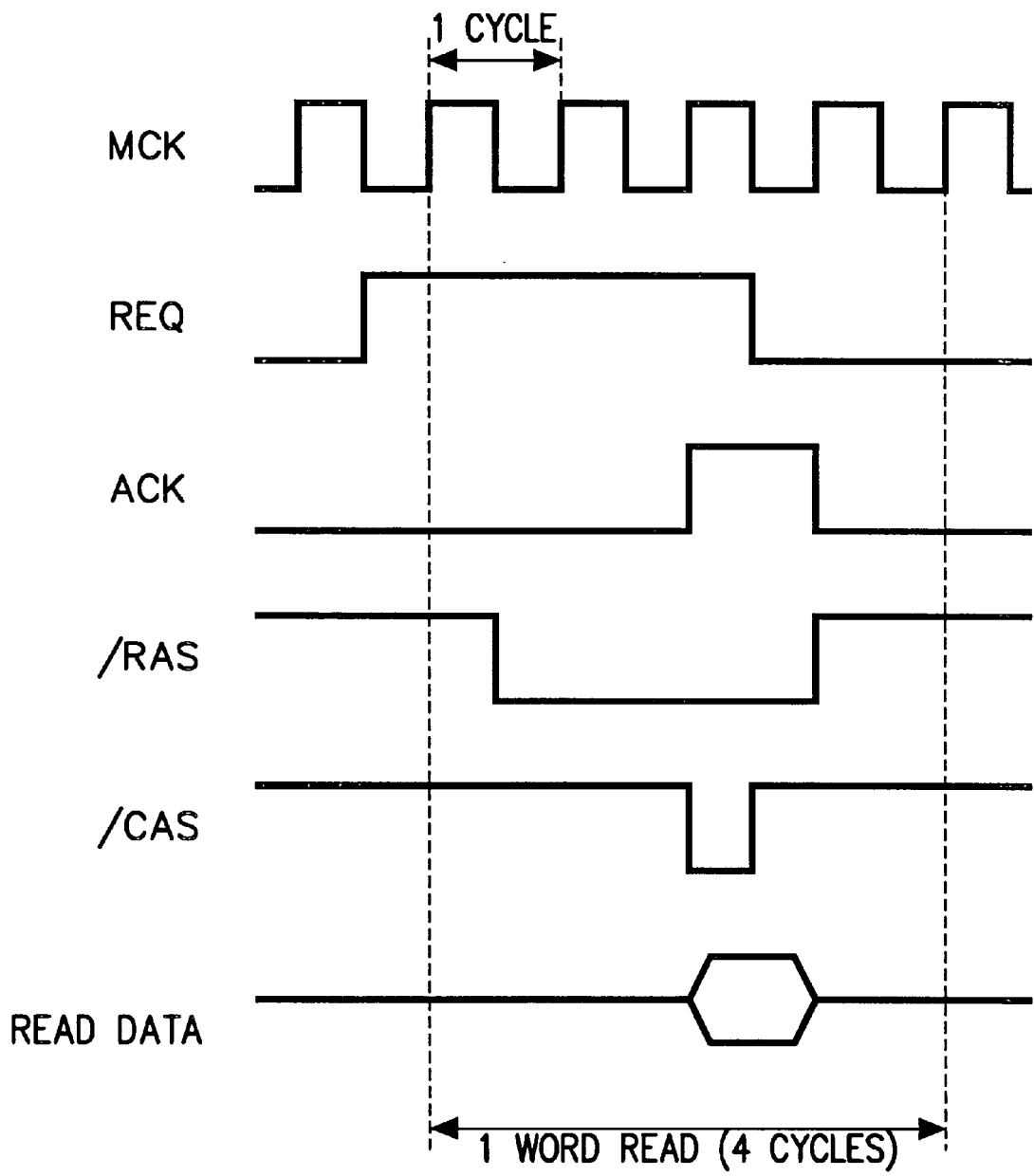
FIG. 6 is an operational timing diagram when reading one word in FIG. 4.

The read operation will be explained with reference to FIG. 6 by taking as an example, the operational timing diagram upon a 1 word read operation of the memory read circuit 102 as shown in FIG. 4.

The read controller 112 starts one memory read operation at a rising edge of a main clock signal MCK after a read request signal REQ is activated as the logic "high" level by the ECC processor. Then, the read controller 112 activates the column address strobe (hereinafter, referred to as CAS) as the logic "low" level in a third cycle after activating the row address strobe (hereinafter, referred to as RAS) as the logic "low" level in a first cycle. In this instance, the symbol data designated by the physical address of the read controller 112 is read from the data memory 100 to the ECC processor. At the same time, the read controller 112 activates the response signal ACK as the logic "high" level. Hereinafter, the read controller 112 completes one memory read operation depending upon the completion of the fifth cycle. The symbol counter 106 increases the count value by one in accordance with the response signal ACK generated during the above memory read operation, and when the count value of the symbol counter 106 becomes 25, the code word counter 104 increases the count value by one in accordance with the next response signal ACK. Then, the count value of the symbol counter 106 is again initialized as 0.

As described above, the memory read circuit 102 applies one physical address from the read controller 112 to the data memory 100 regarding one memory read operation and uses a total of 4 cycles for one memory read operation.

Herein, the number of the cycles in conventional systems used for reading the data from the data memory 100 so as to process the P code word for one sector data will be briefly observed. Since there exist 26 symbols per 1 code word, 26 memory read operations are required. Also, since there exist a total of 43 code words at the left plane, 43×26=1118 memory read operations are necessary. Therefore, the number of the total memory cycles required at the left plane for processing the P code word to one sector data amounts to 1118×4=4471 cycles.

Further, the memory read cycles are used for reading the symbols for the ECC, one by one at each memory read operation from the data memory 110. Furthermore, there has been a limit in increasing the speed of operation in CD-ROM drives due to the large number of memory read cycles required for the ECC.

Thus, the present invention reduces the number of the memory read cycles for the ECC by reading the data memory 110 by a unit of several symbols in the page read cycle by using the page mode read cycle of the DRAM. That is, when accessing the DRAM in the page mode, the number of the memory read cycles used is reduced. Thereby, the present invention can decrease the number of the memory read cycles by adapting the foregoing in reading the P code words or the Q code words.

Figure 7:
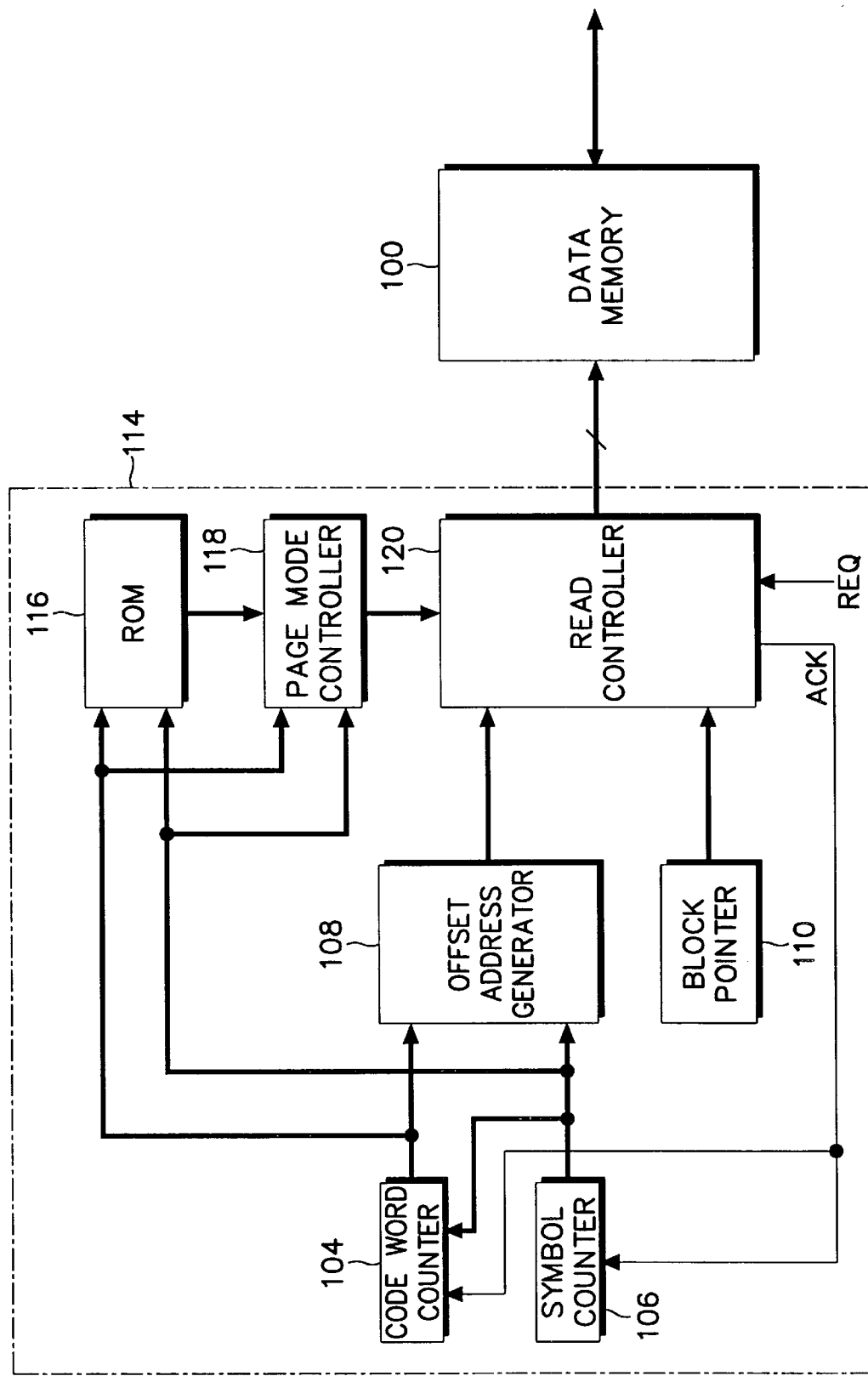
FIG. 7 is a block diagram showing a memory read circuit according to an embodiment of the present invention.

FIG. 7 is a block diagram showing a memory read circuit according to an embodiment of the present invention, where the memory read circuit 114 further includes a ROM 116 and a page mode controller 118 in comparison with the memory read circuit 102 of FIG. 4 as discussed above, and controls the read controller 120 to read the data memory 110 in the page mode by the page mode controller 118. FIG. 7 is the case of reading the P code word as shown in FIG. 4. Therefore, the data memory 100 as well as the code word counter 104, the symbol counter 106, the offset address generator 108, and the block pointer 110 are the same as those of FIG. 4, and accordingly, have the same reference numerals as those of FIG. 4.

The ROM 116 stores a ROM table including the page length value designating the page mode for 26 symbols of total 43 P code words regarding one sector data as shown in FIG. 3. Then, the ROM table sets the page length values by a unit of several symbols in accordance with the address of FIG. 2, that is, the address of the actual region where the symbols for each P code word are stored at the data memory 100.

An example of setting the page length values of the ROM table stored at the ROM 116 will be described with the example of the sector data stored as the first block at the data memory 100 as shown in FIG. 2. If the format of the sector data stored as the data block 0 and the auxiliary block 0 is mode 1 and adapting the page mode by a unit of 256 bytes for the data memory 10, the real address of the symbols of the P code word of the left plane as the ECC memory map of FIG. 3 are as illustrated in FIG. 8a. Namely, FIGS. 8a and 8b are examples of setting page length values for the P code word of a data block O and an auxiliary block O as shown in FIG. 2, wherein especially, FIG. 8a shows the physical address of the data memory 100 for the symbols indicative of serial offset values "0000"~"1169" for convenience. When sequentially dividing the addresses "00000"~"1FFFF" of FIG. 2 by a unit of 256 bytes and tying the addresses for 26 symbols for 43 P code words, the addresses are shown as the block expressed as dotted lines in FIG. 8a.

For example, concerning the symbols of the P code word number 0, since the symbol number 0 belongs to one 256 byte unit, the page length value is set as 1. Also, since the symbol numbers 1 to 5 belong to another 256 byte unit, the page length value is set as 5. Additionally, since the symbols numbers 6 to 11 belong to third 256 byte unit, the page length value is set as 6. As a consequence, the symbols for 43 P code words set the page length values using the above method, in correspondence with the actual storing region, which are shown as in following Table 1.

TABLE 1

| code word number | page length value |
|---|---|
| 0~1 | 1, 5, 6, 6, 6, 2 |
| 2~36 | 6, 6, 6, 6, 2 |
| 37~38 | 6, 6, 6, 5, 3 |
| 39~40 | 6, 6, 5, 6, 3 |
| 41~42 | 6, 5, 6, 6, 3 |

As is apparent from the above Table 1, when the format of the sector data, which stores the example of setting the page length value as the data block 0 and auxiliary block 0, is observed as the form 1 of the mode 2 format, the real address of the symbols of the P code word of the left plane according to the ECC memory map of FIG. 3 is as shown in FIG. 8a and the page length values for this will be given in following Table 2.

TABLE 2

| code word number | page length value |
|---|---|
| 0~1 | 1, 6, 6, 5, 6, 2 |
| 2~3 | 1, 6, 5, 6, 6, 2 |
| 4~5 | 1, 5, 6, 6, 6, 2 |
| 6~40 | 6, 6, 6, 6, 2 |
| 41~42 | 6, 6, 6, 5, 3 |

With respect to FIG. 7, the count value of the code word counter 104 and the count value of the symbol counter 106 are applied to the offset address generator 108 and applied to the ROM 116 and the page mode controller 118, simultaneously. Thus, the page length value of the symbol to be currently read among the symbols of the P code word corresponding to the count value of the code word counter 104 is output from the ROM 116. The page length value output from the ROM 116 is applied to the page mode controller 118. The page mode controller 118 operates the read controller 120 in the page mode corresponding to the page length value of the ROM 116 for the symbol to be currently read and corresponding to the count value of the symbol counter 106 in the P code word corresponding to the count value of the code word counter 104. At this case, the operation of the read controller 120 in the page mode by the page mode controller 118 is performed just like the conventional page mode control for the DRAM.

Therein, because the page mode is set in correspondence with the page length value, the page mode is set in correspondence with the number of the corresponding symbols by making the symbols which are consequentially stored at each page equal and of dividing the data memory 100 for the symbols at each code word by the storing region unit of a given size, as a unit.

An operation of the memory read circuit 114 will be explained as follows. Firstly, operations of the code word counter 104, the symbol counter 106, the offset address generator 108 and the block pointer 110 are performed as those of FIG. 4. Additionally, the count values of the code word counter 104 and the symbol counter 106 are applied to the offset address generator 108 as well as the ROM 116 and the page mode controller 118, at the same time. Accordingly, the page mode is controlled by the page mode controller 118 in accordance with the page length value stored at the ROM 116. For example, the first code word, that is, the page length value stored at the ROM table of the ROM 116 regarding the code word 0 is indicated as "1, 5, 6, 6, 6, 2" as shown in the above Table 1. Thus, since the first symbol of the code word number 0, that is, the output page length value of the ROM 116 regarding the symbol number 0 is 1, the memory read operation for the data memory 100 in the page mode 1 is performed by the page mode controller 118. In other words, in this case, only one word is read. However, now that the output page length value of the ROM 116 from the symbol number 1 as the second symbol to the symbol number 5 as the sixth symbol is "5", the page mode controller 118 performs the memory read operation for the data memory 100 in the page mode 5. That is, the memory read operation of the page mode for 1 to 5 words is performed. Thus, the count value of the symbol counter 106 becomes 5. After that, the page mode memory read operation for 6 words, 6 words, 6 words, and 2 words is sequentially performed by the page mode controller 118 as mentioned hereinbefore. After reading the symbols of the code word number 0 is completed, the count value of the code word counter 104 is increased by one. Thereafter, the operation of the code word number 1 as the next code word is continuously performed as above.

Figure 9:
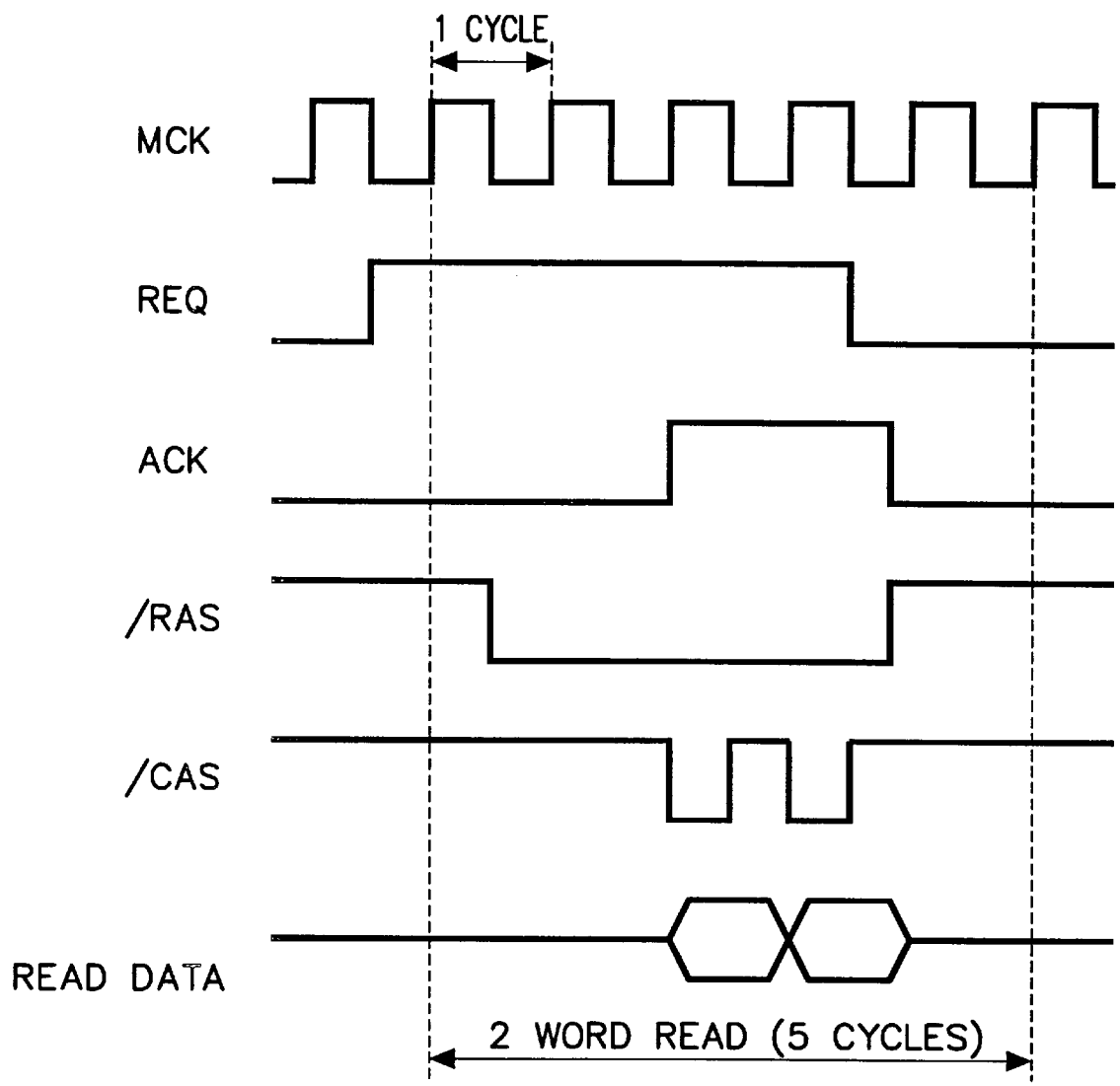
FIG. 9 is an operational timing diagram when reading page mode 2 in FIG. 7.

As a result, the memory read operation in each page mode 1→5→6→6→6→2 for the code word numbers 0 and 1 is performed. Namely, the number of the overall memory read cycles is reduced by performing 26 memory read operation by being divided into 6 page mode read cycles. By way of an example, with reference to FIG. 9 showing the operational timing diagram upon reading the page mode 2, one memory read operation is started at the rising edge of the main clock signal MCK after the read request signal REQ is activated as the logic "high" level by the ECC processor, which is shown in FIG. 6. Only following activation of the RAS as the logic "low" level in the first cycle, the CAS is twice activated as the logic "low" level in third and fifth cycles. Here, the symbol data of 2 words designated by two physical addresses which are consequentially outputted from the read controller 120 is read from the data memory 100 to the ECC processor. Following that, the memory read operation is completed according to completion of the fifth cycle.

While 8 cycles were used in the case of reading 2 words by two memory read operations in the prior art, two words are read by one memory read operation using 5 cycles according to the present invention. Similarly, for example, only 8 memory read cycles are used for reading 5 words by one memory read operation in the page mode 5. In addition, the number of the memory read cycles used at each code word number 0 and 1 becomes 4+8+9+9+9+5=44 cycles. Also, the page mode memory read operations are repeatedly performed to the code word number 42 and only the page mode is varied according to variation of the page length value outputted from the ROM 116. Likewise, when observing the number of the cycles used in reading the data in the data memory 100 for processing the P code word regarding one sector data, total 1681 cycles are used. In this event, as explained in the prior art, the number of the memory read cycles is outstandingly reduced as ⅓ of 4472 cycles used in the prior art.

Accordingly, the CD-ROM drive can easily perform at a high velocity by remarkably reducing the number of the memory read cycles in the ECC which was a limit in increasing the velocity in the high velocity CD-ROM drive.

While the present invention will been particularly shown and described regarding a concrete embodiment thereof, it will be understood by those skilled in the art that various changes in form and details may be effected therein without departing from the spirit and scope of the invention. Specially, whereas processing the P code word was explained in an embodiment of the present invention, the present invention can be equally adapted to the Q code word. Only, in the above case, the count range value of the code word counter 104 and the symbol counter 106 and the offset address generator 108 are varied in correspondence with the Q code word, as well as the page length value which is stored at the ROM 116 according to the variation. Further, the present invention can be equally adapted in reading the memory even when not consequently generating the offset address values of the symbols of the code word just like the data of the CD-ROM drive.

As is apparent from the foregoing, the present invention can easily embody the operation of the CO-ROM at high speed by significantly reducing the number of the memory read cycles necessary for ECC in the decoding device of the CD-ROM drive.

It should be understood that the present invention is not limited to the particular embodiment disclosed herein as the best mode contemplated for carrying out the present invention, but rather that the present invention is not limited to the specific embodiments described in this specification, except as defined in the appended claims.

What is claimed is:

1. A method of reading a memory circuit, used for error correction and checking (ECC) of a data memory, which stores sector data reproduced from a compact disc, and which is arranged in a decoding device of a compact disc-ROM drive, said method comprising the steps of:

counting the number of code words read from said data memory;

counting the number of symbols for each of said code words read from said data memory;

generating an offset address according to count values of said code words and said symbols;

generating a block pointer value for designating a block for said sector data stored in said data memory as a unit block;

generating a physical address and read control signals for symbols to be read which are designated by said offset address and said block pointer value;

storing a page length value which corresponds to said physical address where said symbols for each of said code words for ECC are stored at said data memory;

outputting said page length value according to count values of said code words and said symbols; and reading said data memory in a page mode read cycle of said page length corresponding to said physical address where said symbols for ECC are stored in said data memory.

2. The method as claimed in claim 1, further comprising the step of setting said page mode read cycle to correspond to the number of symbols.

3. The method as claimed in claim 2, wherein said symbols are read in one memory read operation depending upon a corresponding page mode read cycle.

4. The method as claimed in claim 3, wherein said symbols are each symbol of Reed-Solomon Product Code (RSPC) P code word.

5. The method as claimed in claim 3, wherein said symbols are each symbol of Reed-Solomon Product Code (RSPC) Q code word.

6. A memory read circuit for error correction and checking (ECC) of data memory which stores sector data reproduced from a compact disc in a decoding device of a compact disc-ROM drive, comprising:

a code word counter for counting the number of code words read from said data memory for ECC;

a symbol counter for counting the number of symbols for each of said code words read from said data memory;

an offset address generator for generating an offset address according to count values of said code word counter and said symbol counter;

a block pointer for generating a block pointer value for designating a block for said sector data stored at said data memory as a block unit;

a read controller for generating a physical address and read control signals for symbols to be currently read as designated by said offset address, said block pointer value, and a page mode controller output;

a read only memory for storing a page length value which is set in accordance with said physical address, where symbols for each code word for ECC are stored at said data memory regarding said sector data stored at said data memory, and for outputting said page length value according to said count values of said code word counter and said symbol counter; and a page mode controller for operating said read controller in a page mode read cycle according to said page length value output from said read only memory.

7. The circuit as claimed in claim 6, wherein said page length value is set according to the number of corresponding symbols designated by said block unit, so that symbols of each code word are stored at the same page into storing region units of a given size.

8. The circuit as claimed in claim 7, wherein said symbols are read in one memory read operation depending upon a corresponding page mode.

9. The circuit as claimed in claim 8, wherein said code word is a Reed-Solomon Product Code (RSPC) P code word.

10. The circuit as claimed in claim 8, wherein said code word is a Reed-Solomon Product Code (RSPC) Q code word.

* * * * *